(12) United States Patent
Yu

(10) Patent No.: US 6,630,712 B2
(45) Date of Patent: *Oct. 7, 2003

(54) TRANSISTOR WITH DYNAMIC SOURCE/DRAIN EXTENSIONS

(75) Inventor: Bin Yu, Santa Clara, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 61 days.

(21) Appl. No.: 09/372,705

(22) Filed: Aug. 11, 1999

(65) Prior Publication Data

US 2001/0038123 A1 Nov. 8, 2001

(51) Int. Cl.$^7$ .......................... H01L 29/76; H01L 29/94
(52) U.S. Cl. ................... 257/344; 257/408; 257/410; 257/412
(58) Field of Search ................... 257/336, 344, 257/408, 410, 412, 900; 438/216, 585, 587

(56) References Cited

U.S. PATENT DOCUMENTS

| 4,714,519 | A | * | 12/1987 | Pfiester | 438/304 |
| 5,955,759 | A | * | 9/1999 | Ismail et al. | 257/332 |
| 6,177,700 | B1 | * | 1/2001 | Lee | 257/306 |
| 6,204,112 | B1 | * | 3/2001 | Chakravarti et al. | 438/243 |

FOREIGN PATENT DOCUMENTS

JP        5-243261        *  9/1993

* cited by examiner

Primary Examiner—Tom Thomas
Assistant Examiner—Hung Kim Vu
(74) Attorney, Agent, or Firm—Foley & Lardner

(57) ABSTRACT

A method of fabricating an integrated circuit with a transistor having less susceptibility to off-state leakage current and short-channel effect is disclosed. The transistor includes high-K gate dielectric spacers and a T-shaped gate conductor. The high-K dielectric spacers can be tantalum pentaoxide or titanium dioxide. The process can be utilized for P-channel or N-channel metal oxide field semiconductor effect transistors (MOSFETs). The T-shaped conductor forms dynamic source/drain extensions.

19 Claims, 2 Drawing Sheets

TRANSISTOR WITH DYNAMIC SOURCE/DRAIN EXTENSIONS

FIELD OF THE INVENTION

The present invention relates to integrated circuits (ICs) and methods of manufacturing integrated circuits. More particularly, the present invention relates to a transistor and method of manufacturing the transistor. The transistor is advantageously less susceptible to short channel effects and high leakage current.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETS). The transistors can include semiconductor gates disposed between drain and source regions. The drain and source regions are typically heavily doped with a P-type dopant (boron) or an N-type dopant (phosphorous).

The drain and source regions generally include a thin or shallow extension that is disposed partially underneath the gate to enhance the transistor performance. Shallow source and drain extensions help to achieve immunity to short-channel effects, which degrade transistor performance for both N-channel and P-channel transistors. Short-channel effects are among the most important scaling issues for mainstream CMOS technology and can cause threshold voltage roll-off and drain-inducted barrier lowering. Shallow source and drain extensions and, hence, controlling short-channel effects, are particularly important as transistors become smaller.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or an ion-implantation process. Without the sidewall spacers, the doping process introduces dopants into a thin region (i.e., just below the top surface of the substrate) to form the drain and source extensions as well as to partially form the drain and source regions.

After the drain and source extensions are formed, silicon dioxide spacers, which abut lateral sides of the gate structure, are provided over the source and drain extensions. The substrate is doped a second time to form the deeper source and drain regions. The source and drain extensions are not further doped due to the blocking capability of the silicon dioxide spacer.

As transistors disposed on integrated circuits (ICs) become smaller, transistors with shallow and ultra-shallow source/drain extensions have become more difficult to manufacture. For example, smaller transistors should have ultra-shallow source and drain extensions (less than 30 nanometer (nm) junction depth). Forming source and drain extensions with junction depths of less than 30 nm is very difficult using conventional fabrication techniques.

Conventional ion-implantation and diffusion-doping techniques make transistors on the IC susceptible to short-channel effects, which result in a dopant profile tail distribution that extends deep into the substrate. Also, conventional ion-implantation techniques have difficulty maintaining shallow source and drain extensions because point defects generated in the bulk semiconductor substrate during ion implantation can cause the dopant to more easily diffuse (transient enhanced diffusion, TED). The diffusion often extends the source and drain extensions vertically into the bulk semiconductor substrate.

Furthermore, as transistors disposed on integrated circuits (ICs) become smaller (e.g., transistors with gate lengths approaching 70 nm or less), source and drain extension depths need to be aggressively reduced to achieve acceptable immunity to the short-channel effect. For example, a transistor having a gate length of less than 70 nm should have an ultra-shallow source/drain extension (e.g., depth of 10–20 nm). However, the formation of the ultra-shallow source/drain extension is very difficult. For example, ultra-shallow source/drain extensions are susceptible to significant dopant loss during the low-KeV implantation, as well as to increased transient-enhanced diffusion (TED), which make the junction depth much deeper. These problems can prevent the manufacture of a ULSI integrated circuit having transistors with gate lengths of less than 50 nm.

Another important factor associated with reduced transistor size relates to transistor leakage current. As the physical length of the gate is reduced to increase the transistor on-state drive current, the spacing between the source and drain extensions becomes closer. The off-state leakage current dramatically increases as the source/drain extensions become closer. Increased off-state leakage current increases the power consumption and heat generated by an integrated circuit.

Thus, there is a need for a transistor that has reduced off-state leakage current and increased on-state drive current. Further still, there is a need for a transistor with the reduced off-state leakage current and with less susceptibility to short-channel effects. Further still, there is a need for source/drain extensions that do not contribute to off-state leakage current. Even further still, there is a need for a method of making a novel transistor structure that is less susceptible to off-state leakage current and, yet, has acceptable on-state drive current.

SUMMARY OF THE INVENTION

One embodiment of the present invention relates to a transistor with dynamic source/drain extensions. The transistor includes a source, a drain, and a gate structure. The gate structure is disposed between the source and the drain and has a T-shaped gate electrode. The T-shaped gate electrode has a first wing and a second wing. Deep inversion layers are formed under the first wing and the second wing when a signal is applied to the T-shaped gate electrode. The deep inversion layers act as dynamic source/drain extensions.

Another embodiment of the present invention relates to an integrated circuit with a transistor having a gate electrode means. The gate electrode structure turns the transistor on in response to a gate signal having a first level and turns the transistor off in response to the gate signal having a second level. The gate electrode structure is configured to form source/drain extensions in response to the first level. The source/drain extensions are absent when the second level is applied to the gate electrode structure.

A further embodiment of the present invention relates to a method of fabricating an integrated circuit on a substrate. The integrated circuit includes at least one transistor with dynamic source/drain extensions. The method includes providing a gate conductor between a source and a drain, providing a dielectric layer over the gate conductor, removing the dielectric layer until a top surface of the dielectric layer is below a top surface of the gate conductor, and depositing a conductive material over the gate conductor and the dielectric layer. The method further includes removing the conductive material to leave a first wing of the conductive material coupled to the gate conductor and a second wing of the connective material coupled to the gate conductor, and removing the dielectric layer to leave spacers beneath the first wing and the second wing.

BRIEF DESCRIPTION OF THE DRAWINGS

Exemplary embodiments will hereafter be described with reference to the accompanying drawings, wherein like numerals denote like elements, and.

DETAILED DESCRIPTION OF THE PREFERRED EXEMPLARY EMBODIMENTS

Figure 1:
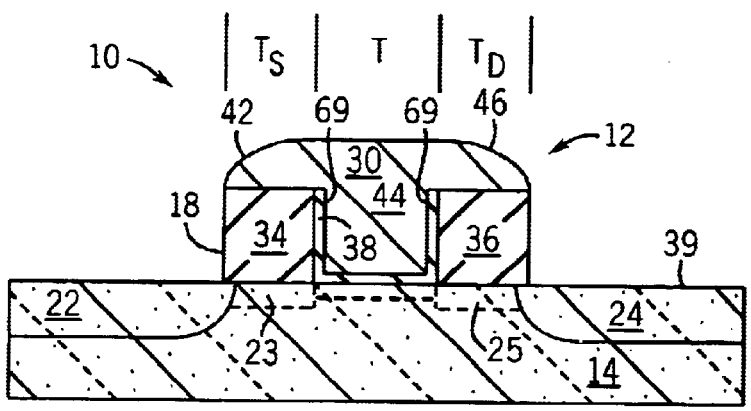
FIG. 1 is a cross-sectional view of a portion of an integrated circuit including a transistor with dynamic source/drain extensions in accordance with an exemplary embodiment.
Figure 2:
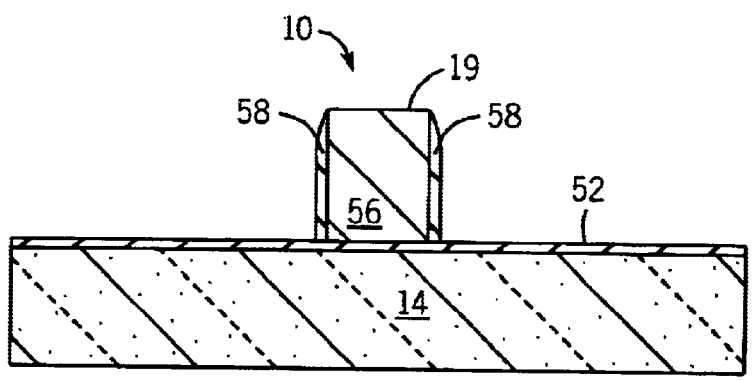
FIG. 2 is a cross-sectional view of the portion of the integrated circuit illustrated in FIG. 1, showing a gate stack formation step.

FIG. 1 shows an advantageous transistor structure with dynamic source/drain extensions. FIGS. 2–6 illustrate an advantageous complementary metal oxide semiconductor (CMOS) fabrication process for forming the advantageous transistor structure on a substrate. The advantageous process and operation of the transistor structure is described below, with reference to FIGS. 1–6, as follows.

With reference to FIG. 1, a transistor 12 is disposed on a semiconductor substrate 14, such as, a single crystal silicon wafer. Transistor 12 is part of a portion 10 of an integrated circuit (IC) manufactured on a wafer. Transistor 12 preferably has a gate length of less than 70 nanometer (nm) (e.g., approaching 50 nm). Substrate 14 can be any semiconductor material, including gallium arsenide (GaAs), silicon (Si), germanium (Ge), or other material. Alternatively, substrate 14 can be a thin-film or epitaxial layer that is part of a silicon-on-insulator substrate.

Transistor 12 includes a gate stack or structure 18, a source region 22, and a drain region 24. Transistor 12 also includes a dynamic source extension 23 and a dynamic drain extension 25, respectively. In the exemplary embodiment, source region 22 and drain region 24 are 60–120 nm deep (60–120 nm below a top surface 39 of substrate 14).

Transistor 12 can be an N-channel or a P-channel field effect transistor (FET). Source and drain regions 22 and 24, respectively, can be planar, as shown in FIG. 1, or can be raised or elevated source and drain regions. Source and drain regions 22 and 24, respectively, have a concentration of $10^{19}$ to $10^{20}$ dopants per cubic centimeter.

Dynamic source and drain extensions 23 and 25, respectively, are preferably ultra-shallow extensions (e.g., junction depth is less than 30 nm, (10–20 nm or 5–10)), which are thinner (i.e., shallower) than corresponding source and drain regions 22 and 24, respectively. When present, each of dynamic source and drain extensions 23 and 25 has a width of 500–600 Å (from left-to-right) and is integral with corresponding source and drain regions 22 and 24, respectively. Dynamic source and drain extensions 23 and 25, respectively, are disposed partially underneath a gate dielectric layer 38.

Dynamic source and drain extensions 23 and 25 help transistor 12 achieve substantial immunity to short-channel effects and, yet, do not significantly contribute to on-state current leakage. Dynamic source and drain extensions 23 and 25, respectively, are present when transistor 12 is turned on. Preferably, when a gate signal is provided to gate structure 18 that turns transistor 12 on, dynamic source and drain extensions 23 and 25 are present. When a gate signal that turns transistor 12 off is provided to gate structure 18, extensions 23 and 25 are absent (e.g., disappear). Thus, transistor 12 presents an advantageous structure that has dynamic source/drain extensions 23 and 25. Extensions are formed when transistor 12 is in the on-state (e.g., for N-channel MOSFET: gate voltage equals VDD or supply voltage; for P-channel MOSFET: gate voltage equals VSS or ground). Alternatively, other voltage levels could be utilized, depending upon device parameters.

Gate structure 18 is configured so that transistor 12 forms dynamic source and drain extensions 23 and 25, respectively, in response to the appropriate bias level of the gate signal. Gate structure 18 includes a T-shaped electrode or conductor 30, high-K dielectric spacers 34 and 36, and gate dielectric layer 38. T-shaped conductor 30 receives the gate signal and includes a first wing 42, a center portion 44, and a second wing 46. T-shaped conductor 30 controls a first parasitic transistor (TS) associated with wing 42, a second parasitic transistor (TD) associated with wing 46, and a main transistor (T) associated with center portion 44.

Spacers 34 and 36 of transistor 12 advantageously have a high dielectric constant (K) value. For example, spacers 34 and 36 are formed from a material having a K value of greater than 20 (preferably, greater than 25). Spacers 34 and 36 can be a high-K dielectric material, such as, titanium dioxide ($TiO_2$), tantalum pentaoxide ($Ta_2O_5$), aluminum oxide ($Al_2O_3$), or other insulators. Spacers 34 and 36 can also be a composite of several insulating layers made from different materials (e.g., $SiO_2$, $TiO_2$, $TaO_5$, $Si_3N_4$, etc.). Each of spacers 34 and 36 has a width of 500–600 Å and a thickness of 150–500 Å.

Gate structure 18 is preferably 1000–2000 Å thick (i.e., height). Gate dielectric layer 38 is preferably a very thin (20–30 Å) silicon dioxide material formed in a deposit-and-etch back process. Alternatively, gate dielectric layer 38 can be thermally grown. The use of a thin gate oxide, such as, gate dielectric layer 38, on side walls 69, as well as underneath a material 56, (FIG. 2) prevents possible fringing field effects associated with material 56.

T-shaped conductor 30 is preferably a conductive material, such as, doped polysilicon, doped polysilicon/germanium, tungsten, titanium nitride, molybdenum, or other metal conductor. Conductor 30 is 1000–2000 Å thick at center portion 44. Center portion 44 is 350–1000 Å wide. Each of first and second wings 42 and 46, respectively, preferably has a width of 500–600 Å and a thickness of 500–1000 Å.

In operation, dynamic source and drain extensions 23 and 25, respectively, are formed by deep inversion layers related to parasitic transistors (TS) and (TD) associated with first and second wings 42 and 46, respectively. By utilizing high-K dielectric spacers 34 and 36, deep inversion layers are formed which can act as source and drain extensions when the appropriate gate bias is provided to T-shaped conductor 30. Dynamic source and drain extensions 23 and 25, respectively, advantageously reduce off-state leakage and short-channel effects for the main transistor (T) associated with center portion 44. Dynamic source and drain extensions 23 and 25, respectively, do not contribute to off-state leakage because they are not present when transistor 12 is turned off. When transistor 12 is turned on, extensions 23 and 25 are present, thereby reducing short-channel effects.

Applicant has discovered that there is no need for source/drain extensions to be present when transistor 12 is in the off-state and that source/drain extensions are only needed to control short-channel effects in the on-state.

With reference to FIGS. 2–6, the fabrication of transistor 12, including gate T-shaped conductor 30, is described as follows. Conventional CMOS processes are utilized to form most of the elements of transistor 12 shown in FIG. 2.

In an exemplary embodiment, substrate 14 includes a thin gate dielectric layer 52. Thin gate dielectric layer 52 is part of gate dielectric layer 38 (FIG. 1). Gate dielectric layer 52 is preferably 20–30 Å thick and is thermally grown or deposited on substrate 14. A gate stack 19 that provides structure for gate stack 18 (FIG. 1) is provided on top of layer 52.

Gate stack 19 includes a material 56 and spacers 58. Spacers 58 and thin gate dielectric layer 52 form gate dielectric layer 38. Material 56 is preferably a doped polysilicon, doped polysilicon/germanium, tungsten, titanium nitride, molybdenum, or other conductive layer. Spacers 58 are formed in a thin oxide spacer deposition-and-etch back process. Material 56 is preferably 1000–2000 Å thick, and spacers 58 are preferably 80–10 Å wide.

Figure 3:
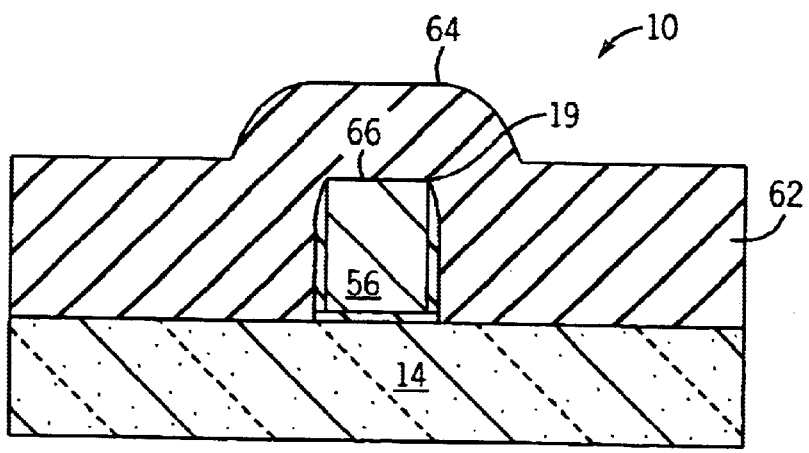
FIG. 3 is a cross-sectional view of the portion of the integrated circuit illustrated in FIG. 2, showing a dielectric layer deposition step.

In FIG. 3, a high-K dielectric material 62 (corresponding to spacers 34 and 36 (FIG. 1)) is provided over gate stack 19 after thin gate dielectric layer 62 is etched from substrate 14. High-K dielectric material 52 can be removed in a dry-etch process. High-K dielectric material 62 is preferably a 3,000–4,000 Å thick layer of silicon nitride, aluminum oxide, titanium oxide, tantalum pentoxide, or other high-K dielectric material. High-K dielectric material 62 is deposited by CVD or formed by a sputtering tool. After deposition, high-K dielectric material 62 is subjected to a chemical mechanical polish until a top surface 64 reaches a top surface 66 of material 56.

Figure 4:
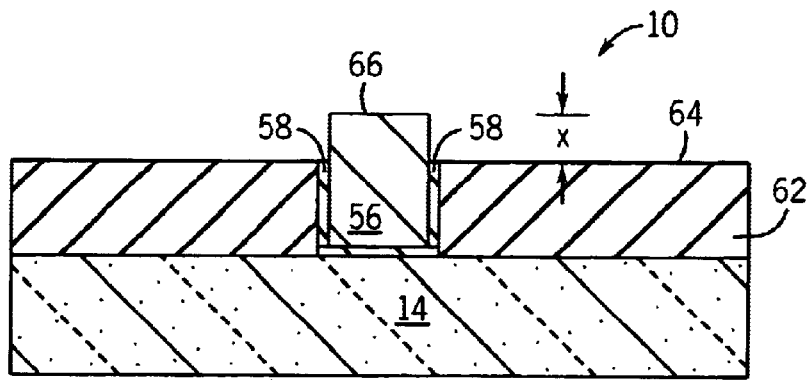
FIG. 4 is a cross-sectional view of the portion of the integrated circuit illustrated in FIG. 3, showing a first removal step for the dielectric layer.

In FIG. 4, top surface 64 of high-K dielectric material 62 is lowered a depth of X below top surface 66 of material 56. Preferably, the depth of X is between 500–1000 Å. The value for X controls the spacing from first and second wings 42 and 46, respectively, from substrate 14 and, hence, the characteristics of parasitic transistors (TS and TD). Application parameters and characteristics of high-K dielectric material 62 can determine what the appropriate distance of X is for forming dynamic source and drain extensions 23 and 25, respectively. Top surface 64 is removed (recessed from top surface 66) in a chemical mechanical process (CMP). The CMP process is selective to spacers 58 and high-K dielectric material 62 with respect to material 56 and exposes material 56 to a depth of X. In addition, the CMP process removes portions of spacers 58.

Figure 5:
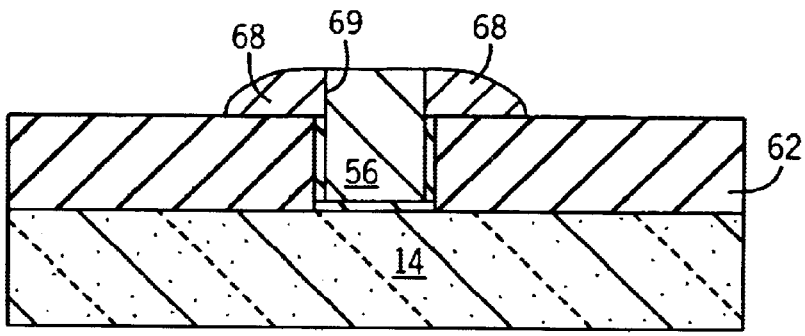
FIG. 5 is a cross-sectional view of the portion of the integrated circuit illustrated in FIG. 4, showing a conductive material deposition step.

In FIG. 5, gate material 68 is deposited on top of high-K dielectric material 62 and is electrically coupled to top surface 64. The combination of gate material 68 and material 56 (conductor 30 in FIG. 1) have a T-shaped or mushroom-shaped configuration. Gate material 68 is preferably blanket deposited and etched back to form spacers on sidewalls 69 of material 56. Preferably, the width of gate material 68 is approximately 500–600 Å. Gate material 68 corresponds to first and second wings 42 and 46, respectively, (FIG. 1).

Figure 6:
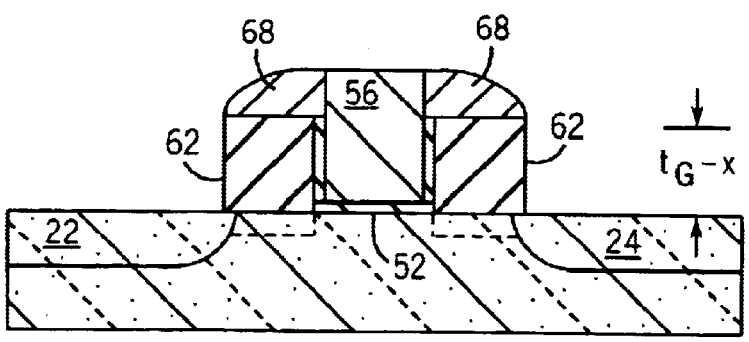
FIG. 6 is a cross-section view of the portion of the integrated circuit illustrated in FIG. 5, showing a second removal step for the dielectric layer.

In FIG. 6, after gate material 68 is deposited, high-K dielectric material 62 is removed in an anisotropic etching process. More specifically, high-K dielectric material 62 can be removed by plasma etch. High-K dielectric material 62 which is not covered by gate material 68 is removed. The thickness of high-K dielectric material 62 under gate material 68 is preferably equivalent with reference to thermal oxide to that of one-third or one-fourth of the thin gate oxide under material 56 (e.g., thin gate dielectric layer 52).

After high-K dielectric material layer 62 is etched, source 22 and drain 24 are doped. Additionally, if gate material 68 and material 56 (gate conductor 30) are polysilicon, material 56 and gate material 68 can be doped at this time. Gate conductor 30 protects the channel region from dopants when permanent source and drain extensions are not formed due to the blocking capability of conductor 30 and spacers 62, thereby reducing off-state leakage current. Source region 22 and drain region 24 are formed.

In FIG. 1, gate structure 18 is designed such that the equivalent thickness with reference to thermal oxide of spacers 34 and 36 is one-fourth to approximately one-third of that of gate dielectric layer 38 underneath center portion 44. Therefore, parasitic transistors (TS and TD) have lower threshold voltages and will be turned on before the main transistor (T) associated with center portion 44. Parasitic transistors (TS and TD) become deeply inverted when the main transistor (T) begins to turn on. The inversion layer formed by the parasitic transistors (TS and TD) act as dynamic source and drain extensions 23 and 25, respectively, for the main transistor (T).

Transistor 12 is designed in such a way that the threshold voltage of the parasitic transistors (TS and TD) is less than the threshold voltage for the main transistor (T) and greater than zero for an N-channel transistor. [0<VTH (TS and TD)<VTH (T)] Conversely, for a P-channel transistor, the threshold voltage of the parasitic transistors (TS and TD) is less than zero and greater than the threshold voltage for the main transistor (T). [VTH (T)<VT (TS and TD)<0] Therefore, when the gate voltage equals 0 (for N-channel), both main transistor (T) and the two parasitic transistors (TS or TD) are turned off and dynamic source and drain extensions 23 and 25 (formed by deep inversion layers of the two parasitic transistors TS and TD) disappear. The off-state leakage current is smaller because of the larger physical space between source region 22 and drain region 24.

It is understood that, while preferred embodiments, examples, materials, and values are given, they are for the purpose of illustration only. The apparatus and method of the invention is not limited to the precise details and conditions disclosed. For example, although a high k dielectric material is mentioned, other materials can be utilized. Thus, changes may be made to the details disclosed without departing from the spirit of the invention, which is defined by the following claims.

What is claimed is:

1. A transistor with dynamic source/drain extensions, the transistor comprising:
   a source;
   a drain; and
   a gate structure disposed between the source and the drain, the gate structure having a T-shaped gate electrode, a first dielectric structure, a second dielectric structure, and a third dielectric structure, the T-shaped gate electrode having a first wing, a center portion and a second wing, wherein the first dielectric structure and the third dielectric structure include high-k dielectric material having a dielectric constant greater than 20 and are disposed under the first wing and under the second wing, respectively, and not under the center portion, the second dielectric structure being below the center portion, the second dielectric structure being a non-high-k dielectric material whereby deep inversion layers are formed under the first wing and the second wing when a signal is applied to the T-shaped gate electrode, the deep inversion layers acting as dynamic source/drain extensions wherein formation of the dynamic source/drain extensions is achieved through a difference in dielectric constants of the high-k dielectric material and the non-high-k dielectric material.

2. The transistor of claim 1, wherein the center portion is closer to a substrate than the first wing and the second wing are to the substrate.

3. The transistor of claim 2, wherein the first dielectric structure is a first high-K dielectric spacer located directly below the first wing, and the third dielectric structure is a second high-K dielectric spacer located directly below the second wing.

4. The transistor of claim 3, wherein the center portion is separated from the substrate, the first dielectric structure, and the third dielectric structure by the second dielectric structure, the second dielectric structure being an oxide liner.

5. The transistor of claim 3, wherein the first and third high-k dielectric spacers include silicon nitride, aluminum oxide, titanium dioxide, or tantalum pentaoxide.

6. The transistor of claim 3, wherein the T-shaped gate electrode includes polysilicon, polysilicon/germanium, tungsten, titanium nitride, or molybdenum.

7. An integrated circuit comprising a transistor having a gate electrode means for receiving a gate signal, wherein the gate electrode means includes a first portion and a third portion disposed above a high-k dielectric material, and a second portion disposed above a non-high-k gate dielectric material, the second portion being between the first portion and the third portion, the transistor being in an on-state in response to a gate signal having a first level and being in an off-state in response to the gate signal having a second level, wherein source/drain extensions are formed in response to the first level, and the source/drain extensions are absent in response to the second level, the high-K dielectric material having a dielectric constant greater than 20, wherein formation of the source/drain extensions is due to a difference in dielectric constants of the high-k dielectric material and the non-high-k dielectric material, wherein the gate electrode means includes a T-shared gate electrode.

8. The integrated circuit of claim 7, wherein the second portion a center portion disposed between a first wing and a second wing, the first wing being the first portion and the second wing being the third portion, wherein the center portion is closer to a substrate than the first wing and the second wing are to the substrate.

9. The integrated circuit of claim 7, wherein the gate electrode means is disposed between a drain region having a junction depth of more than 600 Å and a source region having a junction depth of more than 600 Å.

10. The integrated circuit of claim 9, wherein the source/drain extensions have a junction depth of less than 5–10 nanometers.

11. The integrated circuit of claim 7, wherein a difference in width between a top of the T-shaped gate electrode and a bottom of the T-shaped gate electrode is 1000–1200 Å wide.

12. The integrated circuit of claim 7, wherein the T-shaped electrode is provided over a pair of spacers.

13. The integrated circuit of claim 12, wherein the spacers are thick enough so that the spacers' equivalent thickness to a gate oxide is one-third to one-fourth the thickness of the gate oxide.

14. A transistor comprising:
   a source region;
   a drain region; and
   a gate, the gate being disposed between the source and the drain, the transistor being in an on-state in response to a gate signal having a first level and being in an off-state in response to a gate signal having a second level, wherein source and drain extensions are formed in response to the first level and are absent in response to the second level, the gate having a T-shaped gate electrode, a first dielectric structure, a second dielectric structure, and a third dielectric structure, the T-shaped gate electrode having a first wing, a center portion, and a second wing, wherein the first dielectric structure and the third dielectric structure include high-k dielectric material and are disposed under the first wing and under the second wing, respectively, and not under the center portion, the second dielectric structure being below the center portion, the second dielectric structure being a non-high k dielectric material, the high-K dielectric material having a dielectric constant greater than 20, wherein formation of the source and drain extensions is due to a difference in dielectric constants of the high-k dielectric material and the non-high-k dielectric material.

15. A transistor with dynamic source/drain extensions, the transistor being in an on-state in response to a gate signal having a first level and being in an off-state in response to the gate signal having a second level, wherein the dynamic source/drain extensions are formed in response to the first level, and the source/drain extensions are absent in response to the second level, wherein formation of the source/drain extensions is due to a difference in dielectric constants of the high-k dielectric end the non-high-k dielectric material, the transistor being manufactured by a method comprising:
   providing a gate conductor between a source and a drain and above a non-high-k gate dielectric;
   providing a high-k dielectric layer over the gate conductor, the high-k dielectric material having a dielectric constant greater than 20;
   removing the high-k dielectric layer until a top surface of the dielectric layer is below a top surface of the gate conductor;
   depositing a conductive material over the gate conductor and the dielectric layer;
   removing the conductive material to leave a first wing of the conductive material coupled to the gate conductor and a second wing of the conductive material coupled to the gate conductor; and
   removing the high-k dielectric layer to leave spacers beneath the first wing and the second wing, the non-high-k gate dielectric being disposed under the gate conductor between the first wing and the second wing, wherein the gate conductor and conductive material form a T-shaped gate electrode.

16. The transistor of claim 15, wherein the high-k dielectric material is a metal oxide.

17. The transistor of claim 15, wherein the dielectric layer is removed by wet etching.

18. The transistor of claim 15, wherein the dielectric layer is 3000 to 4000 Å thick.

19. The transistor of claim 18, wherein the gate conductor is 1200 to 2000 Å thick.

* * * * *